(12) United States Patent
Domercq et al.

(10) Patent No.: US 9,806,281 B2
(45) Date of Patent: Oct. 31, 2017

(54) LAMINATED ELECTRONIC OR OPTOELECTRONIC ORGANIC DEVICE

(71) Applicant: AGC GLASS EUROPE, Louvain-la-Neuve (BE)

(72) Inventors: Benoit Domercq, Braine-l'Alleud (BE); Marek Novotny, Gozee (BE); Sebastien Linthout, Archennes (BE); Jonathan Vivier, Beuzet (BE); Nunzio Vigneri, Saint-Vaast (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 15 days.

(21) Appl. No.: 14/648,454

(22) PCT Filed: Nov. 28, 2013

(86) PCT No.: PCT/EP2013/074976
§ 371 (c)(1),
(2) Date: May 29, 2015

(87) PCT Pub. No.: WO2014/083110
PCT Pub. Date: Jun. 5, 2014

(65) Prior Publication Data
US 2015/0303404 A1    Oct. 22, 2015

(30) Foreign Application Priority Data

Nov. 29, 2012  (BE) .................................. 2012/0810

(51) Int. Cl.
*H01L 51/52* (2006.01)
*H01L 51/50* (2006.01)

(52) U.S. Cl.
CPC ...... *H01L 51/5246* (2013.01); *H01L 51/5012* (2013.01); *H01L 51/5056* (2013.01);
(Continued)

(58) Field of Classification Search
CPC ............ H01L 51/5246; H01L 51/5012; H01L 51/5056; H01L 51/5072
See application file for complete search history.

(56) References Cited

U.S. PATENT DOCUMENTS

2009/0302760 A1  12/2009  Tchakarov et al.
2010/0148665 A1   6/2010  Farquhar et al.

FOREIGN PATENT DOCUMENTS

EP        1 079 666 A2    2/2001
JP          8-236271 A    9/1996
(Continued)

OTHER PUBLICATIONS

English machine translation of JP2013-110262.*
(Continued)

*Primary Examiner* — Anne Hines
(74) *Attorney, Agent, or Firm* — Oblon, McClelland, Maier & Neustadt, L.L.P.

(57) ABSTRACT

The invention relates to a structure comprising at least two impermeable substrates, at least one of these substrates being transparent, at least one intermediate adhesive film and at least one electronic or optoelectronic organic device between the two substrates, said device comprising a stack of organic layers comprising a photoelectroactive layer, with, on either side of the latter, additional organic layers that facilitate the transport of charge, among which layers mention may be made of a hole transport layer and an electron transport layer, said stack being inserted between two carriers, said stack of organic layers essentially containing materials the glass transition temperature ($T_{gM}$) of which is such that $T_{gM}-T_{gf} \geq 130°$ C., where $T_{gf}$ is the glass transition temperature of the material from which the intermediate adhesive film is made.

15 Claims, 2 Drawing Sheets

(52) U.S. Cl.
CPC .... *H01L 51/5072* (2013.01); *H01L 2251/556* (2013.01); *H01L 2251/558* (2013.01)

(56) References Cited

FOREIGN PATENT DOCUMENTS

| | | |
|---|---|---|
| JP | 2006-228519 A | 8/2006 |
| JP | 10 2007 039 416 A1 | 2/2009 |
| JP | 2013-110262 A | 6/2013 |
| WO | 2008/012460 A2 | 1/2008 |

OTHER PUBLICATIONS

"Durability Energized by Lanxess", Levapren, pp. 1-24, (Dec. 1, 2013), XP055102830.

"Hole Transport Layer Materials (HTL)", Total 6 Pages, (Jul. 16, 2011), XP055102874.

International Search Report dated Feb. 26, 2014 in PCT/EP13/074976 Filed Nov. 28, 2013.

* cited by examiner

LAMINATED ELECTRONIC OR OPTOELECTRONIC ORGANIC DEVICE

The field of the invention is that of organic electronic devices known under the acronym OTFT (Organic Thin-Film Transistor) or organic optoelectronic devices, such as organic photovoltaic cells, also known as OPV (Organic Photovoltaics), or organic electroluminescent devices denoted under the name OLED (Organic Light-Emitting Device), or also devices comprising electrophoretic ink or "electronic paper".

More specifically, the invention relates to organic electronic or optoelectronic devices incorporated by assembling in glass structures. More particularly, the field of the invention is that of organic light-emitting devices incorporated by assembling in glass structures. The term "assembling" is intended to denote a process requiring, on the one hand, the compression of the components, substrates and interposed film in particular, constituting the glass structure, and, on the other hand, the use of high temperatures, these conditions being necessary to obtain strong adhesion between the interposed film and the two substrates between which said interposed film is imprisoned.

An organic electronic device (OTFT) or optoelectronic device (OPV, OLED) is provided in the form of a first support on which the following are successively deposited:
- a first electrode,
- a stack of organic semiconducting layers which makes possible the emission of light (OLED), or the generation of electric charges (OPV), or the transportation of electric charges (OLED, OPV, OTFT)
- a second electrode,
- and a second cover support or encapsulation support, such as a protective coating against moisture and oxygen, for example.

In the case of an organic light-emitting device, the stack of organic semiconducting layers more particularly comprises a light-emitting layer with, on either side of it, additional organic layers which facilitate the transportation of the charges, including a hole transport layer and an electron transport layer.

The major problems related to organic electronic or optoelectronic devices are, on the one hand, the extreme sensitivity to moisture and to oxygen of the organic materials making up the semiconducting layers and, on the other hand, the very high mechanical weakness of these devices. For this reason, these devices have to be physically protected against any mechanical deterioration and isolated from any external contamination; this is generally carried out by confinement. Such a confinement can be produced when the organic electronic or optoelectronic device is imprisoned between two impermeable substrates. The impermeable substrates are normally chosen from glass, steel or plastics covered with a barrier layer made of inorganic material. Generally, at least one of the substrates, sometimes both, are made of glass.

Conventionally, the assembling of two impermeable substrates, at least one of the substrates of which, sometimes both, is made of glass, requires the use of an interposed adhesive film generally chosen from a polyvinyl butyral (PVB) or an ethylene/vinyl acetate (EVA) copolymer. A conventional assembling cycle, such as that carried out in an autoclave, require the use of high temperatures and of pressures necessary to obtain strong adhesion between the interposed adhesive film and the two substrates between which said interposed adhesive film is imprisoned. When the two substrates are made of glass, the glass structure obtained is referred to as "laminated glass".

However, a major obstacle to the incorporation of organic electronic or optoelectronic devices within an assembly of two impermeable substrates lies in the deterioration in the properties of the materials making up the organic part of said devices when the latter are subjected to a high temperature. For this reason, particular care has to be taken during the assembling of the structure comprising the organic electronic or optoelectronic devices as it is necessary to take into account, on the one hand, the temperatures required in order to obtain adhesion between the laminated substrates and, on the other hand, to avoid a significant deterioration in the properties of the organic materials making up said devices.

For this reason, it is essential for novel structures comprising organic electronic or optoelectronic devices to be developed with the aim of increasing the lifetime of these devices, these structures being obtained by assembling impermeable substrates.

The document BRMU8802233(U2) describes, very briefly, a structure consisting of OLEDs confined between glass substrates without, however, specifically disclosing the nature of the organic compounds used in said organic light-emitting devices. In addition, no process employed to manufacture such a structure is described.

The document WO2008/012460 describes an encapsulated light-emitting device having the objective of providing a simplified electrical connection system. The invention relates to a "surround", over the circumference of the device, acting for at least one electrical connection. The assembling means described in this document are many and varied. WO2008/012460 teaches the importance of choosing an assembly which is leaktight but which also adheres very well to the materials with which it is in contact. In a described configuration, the means for rendering cap and substrate integral is a laminating insert but no specific teaching is given with regard to its choice or the properties which it should have. In point of fact, in attempting to reproduce assemblies as described in WO2008/012460, we observed losses in continuity, problems of diffusion and thus poor operation of the devices produced. Furthermore, the esthetic appearance of the assemblies was not of quality, for example giving "leopard skin" effects.

An objective of the invention is in particular to overcome these disadvantages of the prior art. More specifically, an objective of the invention, in at least one of its embodiments, is to provide a laminated glass comprising an organic electronic or optoelectronic device, preferably an organic light-emitting device.

Another objective of the invention, in at least one of its embodiments, is to employ a process for the manufacture of laminated glass comprising at least one organic electronic or optoelectronic device, preferably at least one organic light-emitting device.

The invention, in at least one of its embodiments, also has the objective of providing uses of laminated glass incorporating at least one organic electronic or optoelectronic device, preferably at least one organic light-emitting device.

In accordance with a specific embodiment, the invention relates to a structure comprising at least two impermeable substrates, at least one of these substrates being transparent, at least one interposed adhesive film, preferably just one interposed adhesive film, and at least one organic electronic or optoelectronic device between the two substrates, said device comprising a stack of organic semiconducting layers which makes possible the emission of light, the generation of electric charges and/or the transport, said stack being inserted between two supports.

According to the invention, such a structure is such that the stack of organic semiconducting layers consists of, that is to say contains exclusively, materials for which the glass transition temperature ($Tg_M$) is such that:

$$Tg_M - Tg_f \geq 130° C., \text{ preferably } \geq 140° C., \text{ more preferably } \geq 150° C., \text{ most preferably } \geq 160° C.,$$

with $Tg_f$: glass transition temperature of the material constituting the at least one interposed adhesive film, preferably the sole interposed adhesive film.

The general principle of the invention is based on a selection of the materials of the stack of organic semiconducting layers as a function of the nature of the material constituting the at least one interposed film, preferably the sole interposed film. The inventors have determined that, surprisingly, such a selection could be carried out on the basis of the glass transition temperatures of the different materials constituting the organic semiconducting layers and also the at least one interposed film.

Thus, the invention is based on an entirely novel and inventive approach as it provides a method of selection of the different materials constituting the organic electronic or optoelectronic device, more particularly the organic light-emitting device, more particularly when said structure is obtained by assembling requiring temperatures of greater than 110° C.

Advantageously, the structure according to the invention is such that the at least one interposed adhesive film, preferably the sole interposed film, is composed of one or more layers of plastics, these layers being the same in nature, chosen from the group consisting of polyvinyl butyral (PVB), polyurethanes, in particular thermoplastic polyurethanes or RIM polyurethanes, polycarbonates, polymethyl methacrylates, polypropylenes, ethylene/vinyl acetate copolymers, cycloolefinic copolymers, polyethylenes, in particular in the form of ionomer resins, such as copolymers of (meth)acrylic acid and of ethylene, neutralized by a polyamine, thermoplastic polyesters, in particular poly(ethylene terephthalate)s, or unsaturated thermosetting polymers, optionally modified acrylic resins and vinyl chloride/glycidyl methacrylate copolymers; preferably chosen from the group consisting of polyvinyl butyrals (PVB) and ethylene/vinyl acetate (EVA) copolymers; most preferably ethylene/vinyl acetate (EVA) copolymers. EVA is preferred as it requires shorter processing times for assembling and lower processing temperatures.

According to an embodiment which is preferred or in accordance with the invention, the structure according to the invention is an assembled structure, the materials of which constituting the stack of organic layers have a glass transition temperature ($Tg_M$) which is greater than or equal to the maximum temperature required during the assembling process ($T_a$). The inventors have determined that, surprisingly, observing such a condition makes it possible to reduce the deterioration in the electronic and/or electro-optic properties. "Deterioration in the electronic properties" is understood to denote, in the case of an OTFT (Organic Thin-Film Transistor), a decrease in the charge mobility or in the minimum operating voltage, measured by a current/voltage source (amperometer and/or voltmeter). Deterioration in the electro-optic properties is understood to denote, in the case of an OLED, a decrease in the amount of light emitted by an organic light-emitting device of 10 to 20%, measured by a spectrophotometer, or, in the case of a photovoltaic cell, a decrease in the amount of electricity produced of 20%, preferably of 10%, measured by the difference between the maximum power produced before assembling and after assembling.

According to a preferred embodiment of the preceding embodiment, the structure is such that the glass transition temperature ($Tg_M$) of the materials constituting the stack of organic layers is greater than or equal to 130° C., the inventors having observed that, surprisingly, materials exhibiting such glass transition temperatures are capable of being used during an assembling process requiring temperatures ($T_a$) greater than 110° C., indeed even 120° C.

According to an embodiment which is preferred or in accordance with the invention, the structure according to the invention is such that at least one of the two impermeable substrates is a glass substrate. The advantage related to the use of a glass substrate lies in the combination of the transparency and impermeability properties of the latter. Preferably, the glass substrate is chosen from mineral or organic glasses. Mineral glasses are preferred. Preference is given, among these, to soda-lime-silica glasses which are clear or colored in the body or at the surface. More preferably, these are extra-clear soda-lime-silica glasses. The term extra-clear denotes a glass containing at most 0.020% by weight of the glass of total Fe expressed as $Fe_2O_3$ and preferably at most 0.015% by weight. Preferably, the glass is a tempered glass; more preferably, the glass is a chemically tempered glass. The advantage related to the use of a tempered glass lies in the fact that, during the assembling, the latter has a reduced tendency to deform.

According to a specific embodiment of the preceding embodiment, the structure according to the invention is such that all of the impermeable substrates are glass substrates.

According to a specific embodiment of the two preceding embodiments, the structure according to the invention is such that the glass substrate(s) is (are) flat or curved.

According to a specific embodiment of the three preceding embodiments, the structure according to the invention is such that at least one glass substrate is covered with a conducting layer having a sheet resistance of less than or equal to 15Ω/□. The inventors have determined that, surprisingly, such a layer makes it possible to limit ohmic dissipation and thus makes it possible to obtain structures comprising a plurality of organic electronic or optoelectronic devices inserted between the two substrates, the electronic and/or optoelectronic properties of which are uniform over the electronically and/or optoelectronically active face of the structure. The term "electronic and/or optoelectronic properties of which are uniform" is intended to denote that said properties do not vary by more than 40%, preferably by more than 30%, most preferably by more than 20%, from one point to the other of an electronically and/or optoelectronically active face of the structure according to the invention. The role of this conducting layer is to act as current feed for the electronic or optoelectronic device inserted between the two substrates. When said conducting layer is present on a substrate, the interposed adhesive film is advantageously provided with component holes through which pass electrical connection means chosen from conductive adhesive tapes and conductive adhesives, so as to electrically connect the organic electronic or optoelectronic device inserted between the two substrates to said conducting layer.

According to a specific embodiment of the preceding embodiment, the structure according to the invention is such that the conducting layer is chosen from a silver (single or double Ag) low-e stack or a conductive coating based on doped oxide (TCO), preferably selected from tin-doped indium oxide (ITO), fluorine-doped tin oxide, zinc oxide doped with at least one doping element selected from aluminum and gallium, and tin oxide doped with at least one doping element selected from fluorine and antimony. Preferably, the conducting layer is a transparent layer; said layer is regarded as transparent when it exhibits, within the structure according to the invention, a light absorption of at most 50%, indeed even of at most 30%, preferably of at most 20%, more preferably of at most 10%. The term "light absorption of at most 50%" is intended to denote that the layer in the structure exhibits an absorption of at most 50% of the visible radiation passing through it, said radiation being monochromatic or polychromatic radiation.

According to an alternative embodiment, a transparent conducting film, such as conducting polyethylene terephthalate (PET), is inserted between the interposed adhesive film and the organic electronic or optoelectronic device. Said transparent conducting film acts as current feed for the electronic or optoelectronic device inserted between the two substrates. The advantage of the use of a conducting film is that it makes it possible to avoid the use of an interposed adhesive film provided with component holes, the electrical connections being direct between said conducting film, the organic electronic or optoelectronic device inserted between the two substrates and said conducting layer.

According to a specific embodiment, the structure according to the invention is such that:

$$Y - X \geq 0.3 \text{ mm}$$

with X representing the sum of the thicknesses of the supports constituting the organic electronic or optoelectronic device(s) inserted between the two impermeable substrates, expressed in mm, and Y representing the thickness of the at least one interposed adhesive film, expressed in mm.

The inventors have determined that, surprisingly, this relationship makes possible the selection of interposed adhesive film and of organic electronic or optoelectronic device(s), preferably of the organic light-emitting device(s), capable of being inserted within the structure according to the invention, said structure being more particularly obtained by assembling. Furthermore, such a selection makes it possible to obtain structures exhibiting a better confinement of said devices and therefore providing the devices thus incorporated with a longer lifetime.

The supports constituting the organic electronic or optoelectronic device(s) are such that at least one of the supports, preferably both supports, is (are) transparent. The term "transparent support" is intended to denote a support exhibiting a light absorption of at most 50%, indeed even of at most 30%, preferably of at most 20%, more preferably of at most 10%. The term "light absorption of at most 50%" is intended to denote that the support exhibits an absorption of at most 50% of the visible radiation passing through it, said radiation being monochromatic or polychromatic radiation. One of the two supports is preferably a glass support chosen from mineral or organic glasses. Mineral glasses are preferred. Preference is given, among these, to soda-lime-silica glasses which are clear or colored in the body or at the surface. More preferably, these are extra-clear soda-lime-silica glasses. The term extra-clear denotes a glass containing at most 0.020% by weight of the glass of total Fe expressed as $Fe_2O_3$ and preferably at most 0.015% by weight. Preferably, the glass is a tempered glass; more preferably, the glass is a chemically tempered glass. The advantage related to the use of a tempered glass lies in the fact that, during the assembling, the latter has a reduced tendency to deform.

According to a specific embodiment, the structure according to invention is such that the sum of the thicknesses of the supports of the organic electronic or optoelectronic device(s), preferably of the organic light-emitting device(s), is less than or equal to 2.0 mm, preferably less than or equal to 1.1 mm. The inventors have determined that, surprisingly, thicknesses of supports of less than 2.0 mm, preferably of less than 1.1 mm, make possible better insertion of said devices within the structure, more particularly when said structure is obtained by assembling.

Preferably, the second cover support or encapsulation support has a thickness of less than or equal to 0.7 mm. When it is made of glass, it can be adhesively bonded to the first support and to the stack of organic layers using a "full face" adhesive covering both the stack of organic layers and at least a portion of the first support, with a thickness sufficient to prevent crushing of the organic layers during the assembling. Still when it is made of glass, it can alternatively exhibit a hollow in order for the latter to be positioned facing the organic layers so as to prevent crushing of the organic layers during the assembling, and adhere to the first support via an adhesive strip on its circumference. Alternatively, the cover support or encapsulation support can advantageously be composed of a layer of metal oxide, the metal being selected from the group consisting of Al, Ti, Sn, Zn and Hf, or of metal nitride, the metal being selected from the group consisting of Ti, Ta, W and Nb; preferably, the layer is a layer of metal oxide, more preferably a layer of aluminum oxide, said layer forming a protective coating against moisture and oxygen, for example, and being obtained by ALD (Atomic Layer Deposition).

According to a preferred embodiment, the structure according to the invention is such that the thickness of the interposed adhesive film is greater than or equal to 0.4 mm, preferably greater than or equal to 0.8 mm. The inventors have determined that, surprisingly, thicknesses of interposed adhesive film of greater than or equal to 0.4 mm, preferably of greater than or equal to 0.8 mm, make possible better insertion of said devices within the structure, more particularly when said structure is obtained by assembling. Advantageously, the interposed adhesive film present in the structure can result from the superimposition of two interposed films of the same nature inserting the electronic or optoelectronic device. The electronic or optoelectronic device, for example an OLED, can be deposited on a first interposed adhesive film, said device subsequently being covered with a second interposed adhesive film pierced beforehand with an insertion hole with comparable dimensions to said device and within which said device is inserted. Thus, the thickness of the interposed adhesive film of the structure according to the invention can easily be adapted so as to be of the same order of thickness as the electronic or optoelectronic device.

The second subject matter of the invention is a process for the manufacture of a structure comprising an organic electronic or optoelectronic device, preferably an organic light-emitting device.

According to an advantageous implementation, the process for the manufacture by assembling of a structure comprising an organic electronic or optoelectronic device, preferably an organic light-emitting device, according to the invention is such that it comprises the following successive stages:

a) positioning, on a first substrate, preferably a glass substrate, a first interposed adhesive film,
b) positioning at least one organic electronic or optoelectronic device, preferably at least one organic electronic or optoelectronic device, preferably at least one organic light-emitting device,
c) installing electrical connections, preferably in the form of a transparent conducting film, such as conducting PET, and/or of conductive adhesive tapes.
d) positioning a second interposed adhesive film, preferably of the same nature as the first,
e) positioning a second substrate, preferably a glass substrate,
f) rendering the structure obtained integral by installation of removable fixing means between the first substrate and the second substrate, said means preferably not requiring structural modifications of the substrates and making gas exchanges possible,
g) the structure obtained subsequently being placed in a chamber in order to be subjected to an assembling cycle comprising the following successive stages:
   g 1. venting the assembly obtained by application of a vacuum of at least 0.15 bar, preferably of at least 0.35 bar, for at least 30 minutes, preferably for at least 45 minutes,
   g 2. raising the temperature of the chamber under a vacuum of at least 0.15 bar, preferably of at least 0.35 bar, preferably for at least 45 minutes, until a temperature of at most 120° C., preferably of at most 95° C., is reached,
   g 3. halting the development of vacuum and raising or maintaining the temperature of the chamber for at least 15 minutes, until a temperature of at most 120° C., preferably of at most 110° C., is reached,
   g 4. maintaining the chamber at a temperature of at most 120° C., preferably of at most 110° C., for at least 90 minutes, preferably for at least 150 minutes, more preferably for at least 180 minutes,
   g 5. reducing the temperature of the chamber down to a temperature of at most 80° C.,
   g 6. opening the chamber.

The term "chamber" is understood to denote an autoclave or any container suitable for receiving a structure which has to be subjected to an assembling cycle as defined.

According to an advantageous implementation of the preceding embodiment, the process for the manufacture by assembling of a structure comprising an organic electronic or optoelectronic device, preferably an organic light-emitting device, is such that, during stage g, the structure obtained is placed in a first chamber or container, advantageously chosen from containers which can be deformed by placing under vacuum, such as bags made of airtight fabric or of plastic, in order to be subjected to an assembling cycle comprising the following successive stages:
   g 1. venting the structure obtained by application of a vacuum of at least 0.15 bar in the chamber, preferably of at least 0.35 bar, for at least 30 minutes, preferably for at least 45 minutes,
   g 2. halting the development of vacuum and closing the container, the vacuum being at least 0.15 bar in the container, preferably at least 0.35 bar,
   g 3. the container being subsequently placed in a second chamber or heating chamber, such as an autoclave,
   g 4. raising the temperature of the second chamber, preferably for at least 45 minutes, until a temperature of at most 120° C., preferably of at most 95° C., is reached. Advantageously, the second chamber is placed at a pressure of at most 11 bar, preferably of at most 4 bar, more preferably of at most 3 bar, most preferably of at most 2 bar, the pressure exerted on the first chamber making it possible to reduce the number of gas bubbles in the structure,
   g 5. raising or maintaining the temperature of the second chamber for at least 15 minutes, until a temperature of at most 120° C., preferably of at most 110° C., is reached,
   g 6. maintaining the second chamber at a temperature of at most 120° C., preferably of most 110° C., for at least 90 minutes, preferably for at least 150 minutes, more preferably for at least 180 minutes,
   g 7. reducing the temperature of the second chamber down to a temperature of at most 80° C.,
   g 8. opening the second chamber and recovering the container,
   g 9. opening the container.

The advantage provided by the use of containers which can be deformed by placing under vacuum, such as bags made of airtight fabric or of plastic, such as, for example, bags made of silicone, is that they make it possible, via the vacuum created, to render the structure obtained integral before it is heat treated.

According to an advantageous implementation, the process for the manufacture by assembling of a structure comprising an organic electronic or optoelectronic device, preferably an organic light-emitting device, is such that, during stage g, the structure obtained is placed in a chamber in order to be subjected to an assembling cycle comprising the following successive stages:
   g 1. venting the assembly obtained by application of a vacuum of at least 0.35 bar, for at least 30 minutes, preferably for at least 45 minutes,
   g 2. raising the temperature of the chamber under a vacuum in the chamber of at least 0.35 bar, for at least 45 minutes, until a temperature of at most 95° C. is reached,
   g 3. halting the development of vacuum and raising the temperature of the chamber for at least 15 minutes, until a temperature of at most 120° C., preferably of at most 110° C., is reached,
   g 4. maintaining the chamber at a temperature of at most 120° C., preferably at most 110° C., for at least 150 minutes, preferably for at least 180 minutes,
   g 5. reducing the temperature of the chamber down to a temperature of at most 80° C.,
   g 6. opening the chamber.

According to a specific implementation, the process for the manufacture by assembling of a structure comprising an organic electronic or optoelectronic device, preferably an organic light-emitting device, according to the invention is such that stage a) comprises the use of a substrate covered with a conductive coating and with an interposed adhesive film provided with component holes and that an additional stage of installing electrical connections b') is introduced between stages a) and b), said electrical connections of stage b') being made through the component holes of the adhesive film of stage a). The advantage of this alternative form is that it avoids the use of a transparent conducting film.

According to a preferred implementation, the process according to the invention is such that the fixing means of stage f) are chosen from clips and porous adhesive tapes. Preferably, the fixing means are porous adhesive tapes. The use of porous adhesive tapes is more particularly preferred during the use of containers which can be deformed by being placed under vacuum, such as bags made of airtight fabric or of plastic, such as, for example, bags made of silicone, said tapes making it possible to prevent possible tearing of said deformable containers.

According to a specific implementation of the two preceding forms, the process according to the invention is such that the electrical connection means are chosen from conductive adhesive tapes and conductive adhesives.

The holes made in the interposed film in order to provide the electrical connection or the insertion of the electronic or optoelectronic device are advantageously made by a laser in order to obtain better control of the cutting. In the case of the holes which make possible the installation of the electrical connections, these holes are preferably of cylindrical shape and preferably exhibit a diameter of the order of 1.0 mm.

According to an implementation alternative to the preceding form, the process for the manufacture by assembling of a structure comprising an organic electronic or optoelectronic device, preferably an organic light-emitting device, is such that it comprises the following successive stages:
  a) depositing at least one organic electronic or optoelectronic device, preferably of at least one organic light-emitting device, directly on a first substrate, preferably a glass substrate, covered with a conducting layer,
  b) installing electrical connections, preferably in soldered wire form, between the organic light-emitting device and the conducting layer.
  c) depositing a first interposed adhesive film,
  d) depositing a second substrate, preferably a glass substrate,
  e) rendering the structure obtained integral by installation of removable fixing means between the first substrate and the second substrate, said means not requiring structural modifications of the substrates and making gas exchanges possible,
  f) the structure obtained being subsequently placed in a chamber in order to be subjected to an assembling cycle comprising the following successive stages:
    f 1. venting the assembly obtained by application of a vacuum of at least 0.15 bar, preferably of at least 0.35 bar, for at least 30 minutes, preferably for at least 45 minutes,
    f 2. raising the temperature of the chamber under a vacuum of at least 0.15 bar, preferably of at least 0.35 bar, preferably for at least 60 minutes, more preferably for at least 45 minutes, until a temperature of at most 120° C., preferably of at most 95° C., is reached,
    f 3. halting the development of vacuum, preferably for at least 15 minutes, until a temperature of at most 120° C., preferably of at most 110° C., is reached,
    f 4. maintaining the chamber at a temperature of at most 120° C., preferably of at most 110° C., for at least 90 minutes, preferably for at least 120 minutes, more preferably for at least 150 minutes, most preferably for at least 180 minutes,
    f 5. reducing the temperature of the chamber down to a temperature of at most 80° C.,
    f 6. opening the chamber.

The term "chamber" is understood to denote an autoclave or a container.

According to a preferred implementation of the preceding embodiment, the process for the manufacture by assembling of a structure comprising an organic electronic or optoelectronic device, preferably an organic light-emitting device, is such that, during stage f, the structure obtained is placed in a first chamber or container, advantageously chosen from containers which can be deformed by placing under vacuum, such as bags made of airtight fabric or of plastic, in order to be subjected to an assembling cycle comprising the following successive stages:
  f 1. venting the assembly obtained by application of a vacuum of at least 0.15 bar in the container, preferably of at least 0.35 bar, for at least 30 minutes, preferably for at least 45 minutes,
  f 2. halting the development of vacuum and closing the container, the vacuum being at least 0.15 bar in the container, preferably at least 0.35 bar,
  f 3. the container being subsequently placed in a second chamber or heating chamber, such as an autoclave,
  f 4. raising the temperature of the second chamber preferably for at least 60 minutes, more preferably for at least 45 minutes, until a temperature of at most 120° C., preferably of at most 95° C., is reached. Advantageously, the second chamber is placed under a pressure of at most 11 bar, preferably of at most 4 bar, more preferably of at most 3 bar, most preferably of at most 2 bar, the pressure exerted on the first chamber making it possible to reduce the number of gas bubbles in the structure,
  f 5. raising or maintaining the temperature, preferably for at least 15 minutes, until a temperature of at most 120° C., preferably of at most 110° C., is reached,
  f 6. maintaining the chamber at a temperature of at most 120° C., preferably of at most 110° C., for at least 90 minutes, preferably for at least 120 minutes, more preferably for at least 150 minutes, most preferably for at least 180 minutes,
  f 7. reducing the temperature of the chamber down to a temperature of at most 80° C.,
  f 8. opening the chamber.

The advantage provided by the use of containers which can be deformed by placing under vacuum, such as bags made of airtight fabric or of plastic, such as, for example, bags made of silicone, is that they make it possible, via the vacuum created, to render the structure obtained integral before it is heat treated.

According to a preferred implementation of the preceding implementation, the process for the manufacture by assembling of a structure comprising an organic electronic or optoelectronic device, preferably an organic light-emitting device, is such that, during stage f, the structure obtained is placed in a chamber in order to be subjected to an assembling cycle comprising the following successive stages:
  f 1. venting the assembly obtained by application of a vacuum in the chamber of at least 0.35 bar, for at least 45 minutes,
  f 2. raising the temperature of the chamber under a vacuum of at least 0.35 bar, preferably for at least 60 minutes, more preferably for at least 45 minutes, until a temperature of at most 95° C. is reached,
  f 3. halting the development of vacuum, preferably for at least 15 minutes, until a temperature of at most 110° C. is reached,
  f 4. maintaining the chamber at a temperature of at most 120° C., preferably of at most 110° C., for at least 90 minutes, preferably for at least 120 minutes, more preferably for at least 150 minutes, most preferably for at least 180 minutes,
  f 5. reducing the temperature of the chamber down to a temperature of at most 80° C.,
  f 6. opening the chamber.

According to a preferred implementation, the process according to the invention is such that the fixing means of stage e) are chosen from clips and porous adhesive tapes.

The invention also relates to the uses of the structure according to the invention, such as, for example, touch screens, light sources in any form, and information display screens.

During use as touch screen based on a capacitive touch function, the capacitive contribution is advantageously engraved by laser directly on the conducting layer. The laser engraving can be located immediately below the first support of the OLED, said engraving preferably being of the same size as the optoelectronic device, preferably as the OLED.

Other characteristics and advantages of the invention will become more clearly apparent on reading the following description of a preferred embodiment, given as simple illustrative and nonlimiting example, and from the appended drawings, in which.

Figure 1:
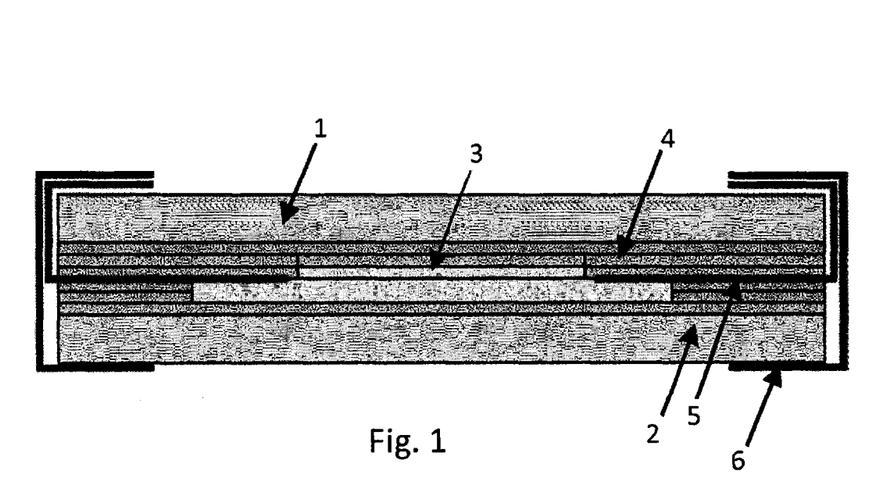
FIG. 1 exhibits a structure according to the invention comprising two substrates made of clear glass (1, 2), an OLED device (3), an interposed adhesive film (4) made of EVA, electrical connection means (5) and an adhesive tape (6)

An embodiment of the structure according to the invention comprising two substrates made of clear glass (1, 2), an OLED device (3), an interposed adhesive film (4) made of EVA, electrical connection means (5) and adhesive tapes (6) is exhibited in connection with FIG. 1. The electrical connection means are a transparent conducting film made of PET, said film being in electrical contact with the device via conductive adhesive tapes. The electrical connection means can also be reduced to the conductive adhesive tapes alone. The conductive adhesive tapes provide the electrical supply of the structure according to the invention.

Figure 2:
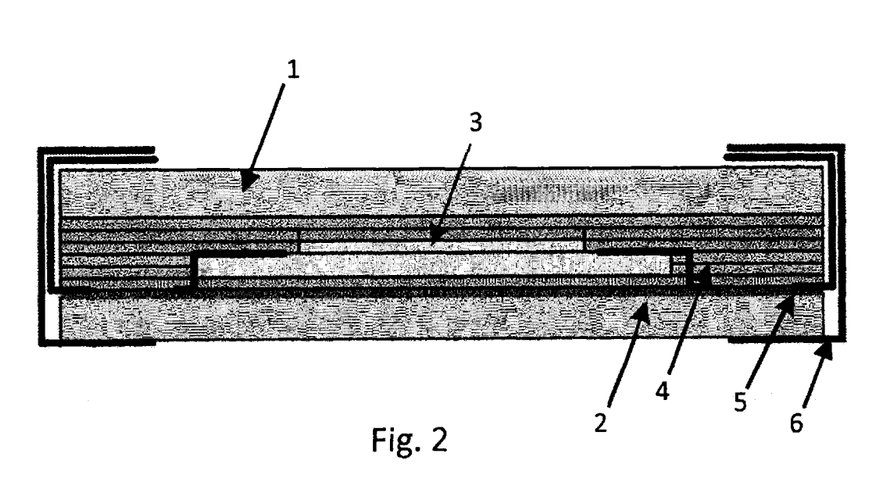
FIG. 2 illustrates a structure according to the invention comprising two substrates made of clear glass (1, 2), an OLED device (3), an interposed adhesive film (4) made of EVA, means for electrical connection (5) via a conducting layer deposited on one of the glass substrates, and an adhesive tape (6)

FIG. 2 illustrates a structure according to the invention comprising two substrates made of clear glass (1, 2), an OLED device (3), an interposed adhesive film (4) made of EVA, means for electrical connection (5) via a conducting layer deposited on one of the glass substrates, and an adhesive tape (6), said layer being engraved. The electrical connection means are a conducting layer covering a substrate made of clear glass and a conductive adhesive inserted through the component holes made in the interposed adhesive film, said layer being in electrical contact with conductive adhesive tapes providing the electrical supply of the structure according to the invention. When the conductive adhesive is used as electrical connection means, the substrate comprising the conducting layer is covered with the interposed adhesive film and it is on the latter that the OLED is deposited. Alternatively to the conductive adhesive, it is possible to use wires as electrical connection means between the OLED and the conducting layer, said wires being soldered to the OLED and to the conducting layer. When wires are used as electrical connection means between the conducting layer and the OLED, the OLED is deposited directly on the substrate carrying the conducting layer; for this reason, the interposed adhesive film is not deposited directly on the substrate carrying the conducting layer but above said substrate provided beforehand with the OLED.

Of course, the invention is not limited to the abovementioned exemplary embodiments.

The process for the manufacture by assembling of a structure comprising an organic electronic or optoelectronic device, preferably an organic light-emitting device, used in this first example is such that it comprises the following successive stages:

a) depositing, on a first glass substrate, an interposed adhesive film,

The interposed adhesive film is chosen made of EVA as, in comparison with PVB:

it requires lower autoclave temperatures (110° C. for EVA versus 125° C. for PVB),
 it requires only a single temperature cycle, PVB needing 2 cycles (pre-sizing and adhesive bonding) in order to obtain the final product,
 it requires the use of a lower pressure in the autoclave, at least 11 bar, compared with at least 15 bar for PVB,
 it does not require control of the humidity and temperature during the process for the manufacture of the laminate, in contrast to PVB,
 EVA requires the use of pressures (positive and negative pressures of the order of 4.0 bar and 0.15 bar) in the autoclave which are lower than the pressures used for PVB, it being possible for said pressures, if they are high, to damage the OLED.

b) positioning an organic light-emitting device,
c) installing electrical connections,
d) depositing a second interposed adhesive film of the same nature as the first,
e) depositing a second glass substrate,
f) rendering the structure obtained integral by installation of removable fixing means between the first substrate and the second substrate. The structure is rendered integral by application of adhesive tapes to the edges of the assembled structure, said tapes being capable of maintaining the structure at a temperature of 110° C., the EVA being fluid at this temperature. The adhesive tapes are applied at each corner of the structure. In addition, the adhesive tapes are provided with holes so as to ensure venting of the structure during the assembling process.
g) the structure obtained being subsequently placed in a heating chamber or autoclave in order to be subjected to an assembling cycle comprising the following successive stages:

g 1. venting the structure obtained by application of a vacuum of at least 0.35 bar in the chamber, for at least 45 minutes. In order to ensure the venting of the structure and to prevent the formation of air bubbles in the EVA, the structure is enclosed beforehand in a bag, preferably made of silicone, in which the vacuum is produced. The vacuum thus produced is sufficient to maintain the structure in place in the bag under vacuum, on the one hand, and to make possible, on the other hand, the venting of the structure in said bag. The venting phase is the first stage before the heating of the autoclave. This stage lasts 45 minutes, g 2. raising the temperature of the chamber under a vacuum of at least 0.35 bar, for at least 45 minutes, until a temperature of at most 95° C. is reached, g 3. raising the temperature of the chamber for at least 45 minutes, until a temperature of at most 110° C. is reached, said chamber no longer being maintained under vacuum. The venting under vacuum is halted by bringing the chamber back to atmospheric pressure.

g 4. maintaining the chamber at a temperature of at most 120° C. for at least 180 minutes. The temperature within the chamber is maintained at 110° C. for at least 150 minutes.

g 5. reducing the temperature of the chamber down to a temperature of at most 80° C. The temperature within the chamber is brought to 80° C., this being done over a period of time of 15 minutes.

g 6. opening the chamber. The temperature of the structure is not left to fall to ambient temperature, the inventors having determined that, surprisingly, EDA requires a sudden decrease in temperature in order for the structure to exhibit a maximum of transparency.

Figure 3:
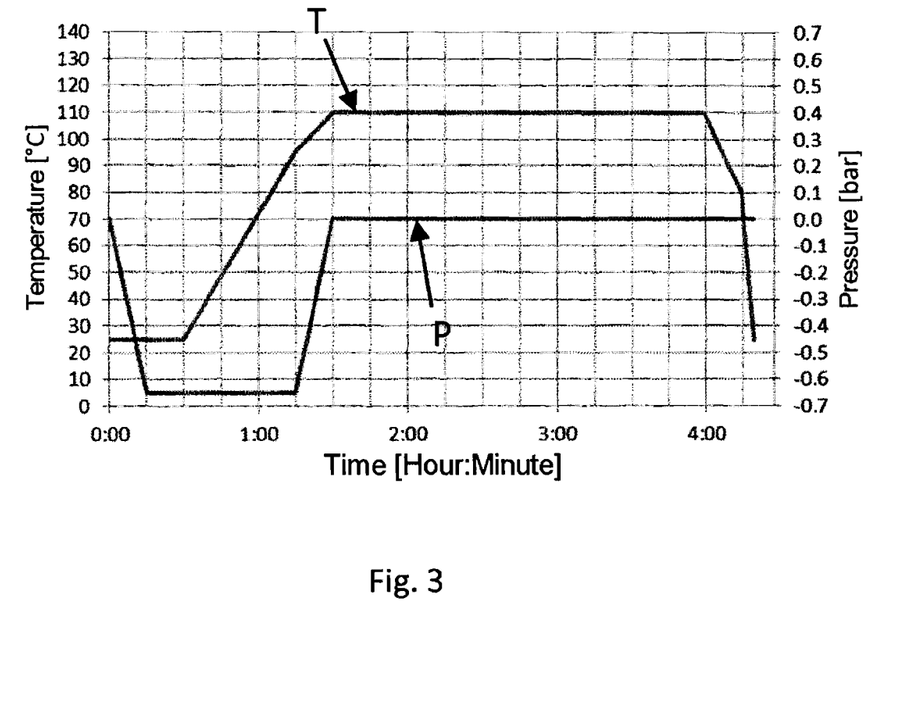
FIG. 3 shows a typical autoclave cycle to which the structure according to the invention is subjected during the assembling thereof.

FIG. 3 presents an autoclave cycle illustrating stage g of the process.

The process for the manufacture by assembling of a structure comprising an organic light-emitting device used in a second example is such that, during stage g, the structure obtained is placed in a bag made of airtight fabric or of plastic, such as a bag made of silicone or a bag produced using Vacfilm 450V or Vacfilm 800G films sold by Aerovac, said films being sealed in order to produce said bag using a polybutylene-based adhesive tape, such as "LTS90B Sealant Tape" sold by Aerovac, in order to be subjected to an assembling cycle comprising the following successive stages:

g 1. venting the structure obtained by application of a vacuum of at least 0.35 bar in the container, for at least 45 minutes, g 2. halting the development of vacuum and closing the bag, the vacuum being at least 0.35 bar in the container, g 3. the bag being subsequently placed in a heating chamber or autoclave, g 4. raising the temperature of the heating chamber or autoclave for at least 45 minutes, until a temperature of at most 95° C. is reached. The autoclave is placed at a pressure of at most 2 bar, the pressure exerted on the bag making it possible to reduce the number of gas bubbles in the structure, g 5. raising the temperature of the heating chamber or autoclave for at least 15 minutes, until a temperature of at most 110° C. is reached, g 6. maintaining the heating chamber or autoclave at a temperature of at most 110° C. for at least 180 minutes, g 7. reducing the temperature of the second chamber down to a temperature of at most 80° C., g 8. opening the heating chamber or autoclave and recovering the bag, g 9. opening the bag.

The inventors have also developed, in a third example, a process for the manufacture by assembling of a structure comprising an organic light-emitting device comprising the following successive stages:

a) positioning an organic light-emitting device directly on a first glass substrate covered with a conducting layer, b) installing electrical connections in soldered wire form between the organic light-emitting device and the conducting layer, c) positioning a first interposed adhesive film, d) positioning a second glass substrate, e) rendering the structure obtained integral by installation of removable fixing means between the first substrate and the second substrate, f) the structure obtained being subsequently placed in a chamber in order to be subjected to an assembling cycle comprising the following successive stages:

f 1. venting the assembly obtained by application of a vacuum of at least 0.35 bar, for at least 45 minutes, f 2. raising the temperature of the chamber under a vacuum of at least 0.35 bar, for at least 45 minutes, until a temperature of at most 95° C. is reached, f 3. halting the development of vacuum for at least 15 minutes, until a temperature of at most 110° C. is reached, f 4. maintaining the chamber at a temperature of at most 110° C. for at least 180 minutes, f 5. reducing the temperature of the chamber down to a temperature of at most 80° C., f 6. opening the chamber.

In the following example, the process for the manufacture by assembling of a structure comprising an organic light-emitting device is such that, during stage f, the structure obtained is placed in a bag made of airtight fabric or of plastic or a bag produced using Vacfilm 450V or Vacfilm 800G films sold by Aerovac, said films being sealed in order to produce said bag using a polybutylene-based adhesive tape, such as "LTS90B Sealant Tape" sold by Aerovac, in order to be subjected to an assembling cycle comprising the following successive stages:

f 1. venting the assembly obtained by application of a vacuum of at least 0.35 bar, for at least 45 minutes, f 2. halting the development of vacuum and closing the bag, the vacuum being at least 0.35 bar in the bag, f 3. the container being subsequently placed in a heating chamber or autoclave, f 4. raising the temperature of the heating chamber or autoclave for at least 45 minutes, until a temperature of at most 95° C. is reached. The autoclave is placed at a pressure of at most 2 bar, f 5. raising the temperature for at least 15 minutes, until a temperature of at most 110° C. is reached, f 6. maintaining the heating chamber or autoclave at a temperature of at most 110° C. for at least 180 minutes, f 7. reducing the temperature of the heating chamber or autoclave down to a temperature of at most 80° C., f 8. opening the heating chamber or autoclave and recovering the bag, f 9. opening the bag.

The invention claimed is:

1. A structure, comprising:
two impermeable substrates, at least one of the two impermeable substrates being transparent;
an interposed adhesive film; and
an organic electronic or optoelectronic device placed between the two impermeable substrates,
wherein said organic electronic or optoelectronic device comprises a stack of organic semiconducting layers comprising a photoelectroactive layer with, on either side of the photoelectroactive layer, additional semiconducting organic layers which facilitate transport of charges,
said stack of organic semiconducting layers emits light, generates electric charges, or transports electric charges,
said stack of organic semiconducting layers is inserted between said two impermeable substrates, at least one of the two impermeable substrates is a glass substrate covered with a conducting layer having a sheet resistance of less than or equal to 15Ω/□, and said stack of organic semiconducting layers comprises exclusively materials for which a glass transition temperature ($Tg_M$) is such that:

$$Tg_M - Tg_f \geq 150° C.$$

with a glass transition temperature ($Tg_f$) of a material constituting the interposed adhesive film.

2. The structure as claimed in claim 1,
wherein the interposed adhesive film comprises at least one layer of plastics selected from the group consisting of a polyvinyl butyral, a polyurethane, a polycarbonate, a poly(methyl methacrylate), a polypropylene, an ethylene/vinyl acetate copolymer, a cycloolefinic copolymer, a polyethylene, a thermoplastic polyester, an acrylic resin and a vinyl chloride/glycidyl methacrylate copolymer.

3. The structure as claimed in claim 1,
wherein the structure is a laminated structure, and
the glass transition temperature ($Tg_M$) is greater than or equal to a maximum temperature required during an assembling process ($T_a$).

4. The structure as claimed in claim 1,
wherein the glass substrate(s) is (are) flat or curved.

5. The structure as claimed in claim 1,
wherein the conducting layer is selected from the group consisting of
a silver low-e stack and
a conductive coating based on a doped oxide (TCO).

6. The structure as claimed in claim 5,
wherein the silver low-e stack is a single silver low-e stack or a double silver low-e stack.

7. The structure as claimed in claim 5,
wherein the doped oxide (TCO) is
tin-doped indium oxide (ITO),
zinc oxide doped with at least one doping element selected from the group consisting of aluminium and gallium, or
tin oxide doped with fluorine or with antimony.

8. The structure as claimed in claim 1,
wherein the structure satisfies a formula:

$$Y - X \geq 0.3 \text{ mm},$$

with X representing a sum of a thicknesses of the supports of the organic electronic or optoelectronic device, expressed in mm, and
Y representing a thickness of the interposed adhesive film, expressed in mm.

9. The structure as claimed in claim 1,
wherein a sum of the thicknesses of the supports of the organic electronic or optoelectronic device is less than or equal to 2.0 mm.

10. The structure as claimed in claim 9,
wherein the sum of the thickness of the supports of the organic electronic or optoelectronic device is less than or equal to 1.1 mm.

11. The structure as claimed in claim 1,
wherein a thickness of the interposed adhesive film is greater than or equal to 0.4 mm.

12. The structure as claimed in claim 11,
wherein the thickness of the interposed adhesive film is greater than or equal to 0.8 mm.

13. The structure as claimed in claim 1,
wherein the organic semiconducting layers comprises a hole transport layer and an electron transport layer.

14. A structure, comprising:
two impermeable substrates, at least one of the two impermeable substrates being transparent;
an interposed adhesive film; and
an organic electronic or optoelectronic device placed between the two impermeable substrates,
wherein said organic electronic or optoelectronic device comprises a stack of organic semiconducting layers comprising a photoelectroactive layer with, on either side of the photoelectroactive layer, additional semiconducting organic layers which facilitate transport of charges,
said stack of organic semiconducting layers emits light, generates electric charges, or transports electric charges,
said stack of organic semiconducting layers is inserted between two supports,
said stack of organic semiconducting layers comprises exclusively materials for which a glass transition temperature ($Tg_M$) is such that:

$$Tg_M - Tg_f \geq 150° C.$$

with a glass transition temperature ($Tg_f$) of a material constituting the interposed adhesive film,
the structure is a laminated structure, and
the glass transition temperature ($Tg_M$) is greater than or equal to a maximum temperature required during an assembling process ($T_a$).

15. A structure, comprising:
two impermeable substrates, at least one of the two impermeable substrates being transparent;
an interposed adhesive film; and
an organic electronic or optoelectronic device placed between the two impermeable substrates,
wherein said organic electronic or optoelectronic device comprises a stack of organic semiconducting layers comprising a photoelectroactive layer with, on either side of the photoelectroactive layer, additional semiconducting organic layers which facilitate transport of charges,
said stack of organic semiconducting layers emits light, generates electric charges, or transports electric charges,
said stack of organic semiconducting layers is inserted between two supports,
said stack of organic semiconducting layers comprises exclusively materials for which a glass transition temperature ($Tg_M$) is such that:

$$Tg_M - Tg_f \geq 150° C.$$

with a glass transition temperature ($Tg_f$) of a material constituting the interposed adhesive film, and
a thickness of the interposed adhesive film is greater than or equal to 0.4 mm.

* * * * *